United States Patent [19]

Neese

[11] Patent Number: 4,598,166
[45] Date of Patent: Jul. 1, 1986

[54] HIGH DENSITY MULTI-LAYER CIRCUIT ARRANGEMENT

[75] Inventor: Wayne E. Neese, Hoffman Estates, Ill.

[73] Assignee: GTE Communication Systems Corporation, Phoenix, Ariz.

[21] Appl. No.: 638,176

[22] Filed: Aug. 6, 1984

[51] Int. Cl.⁴ .............................................. H05K 1/14
[52] U.S. Cl. .................................. 174/68.5; 361/410; 361/414
[58] Field of Search ............... 361/409, 412, 413, 414, 361/416, 410; 174/68.5; 339/17 M, 18 C

[56] References Cited

U.S. PATENT DOCUMENTS

| | | | |
|---|---|---|---|
| 2,932,772 | 4/1960 | Bowman | 361/410 |
| 2,963,626 | 12/1960 | DuVal, Jr. | 361/410 |
| 3,904,934 | 9/1975 | Martin | 361/412 |
| 4,047,132 | 9/1977 | Krajewski | 361/414 |
| 4,150,421 | 4/1979 | Nishihara | 361/410 |
| 4,434,321 | 2/1984 | Betts | 361/414 |

*Primary Examiner*—G. P. Tolin
*Attorney, Agent, or Firm*—Anthony Miologos; Peter Xiarhos

[57] ABSTRACT

An arrangement for constructing multi-layered printed circuits characterized by a first layer having top and bottom surfaces with the top surface including a plurality of parallel conductors divided into at least two conductor groups by a transversely oriented break across each conductor. The bottom surface further includes a plurality of parallel conductors arranged perpendicular to the conductors on the top surface and is also divided into at least two conductor groups by a transversely oriented break across each conductor. A plurality of holes extend through the first layer with, each hole adjacent to an intersecting conductor pair. A second layer including top and bottom surfaces and a plurality of plated-through holes has conductor pennants extending from selected holes in a first direction on the top surface and a second opposite direction on the bottom surface. A plurality of first and second layers are sandwiched together, with each hole of each layer in registration with the other and each conductor pennant contacting a respective first layer conductor. Conductor segments printed on the second layer top and bottom surfaces interconnect selected conductors between respective conductor groups. Additionally, two or more second layers are interconnected by via pins extending through the arrangement.

10 Claims, 4 Drawing Figures

HIGH DENSITY MULTI-LAYER CIRCUIT ARRANGEMENT

CROSS-REFERENCE TO RELATED APPLICATION

The present application is related to co-pending U.S. patent application Ser. No. 638,175 titled, "A High Density Multi-Layered Printed Circuit Arrangement," having the same inventive entity and being assigned the same assignee.

BACKGROUND OF THE INVENTION

This invention relates in general to circuit interconnection devices and more particularly to an arrangement for interconnecting solid state devices and other components that require multi-layer type substrates.

In a number of electronic applications, the interconnection of solid state devices require conductor paths, which if were wires, would cross paths many times. Therefore, to isolate the wire runs, multi-layer type etched or printed circuits are used, whereby specific runs are found on specific layers of the multi-layered circuit isolated from the next.

One present method of accomplishing complex interconnections is by bridging conductive paths with an insulating material and printing a conductor patch on the bridge to series connect the patch with a conductor path, creating in effect, a crossover. This may be repeated many times on a single circuit and with appropriate process steps may be tiered or layered, thus creating the multi-layer circuit.

Another method is to print conductor ink on a plurality of ceramic substrates. The conductor paths on the ceramic substrates are accessed by via holes. Once a set of substrates is printed with appropriate conductor paths, the substrates are aligned and stacked in their required order and fired at high temperatures in a furnace, creating an integral interconnection of conductors. The top layer is generally configured with conductor paths for the assembly of components.

The disadvantages of constructing the multi-layer circuits described above is in the excessive processing cost and the low yield. In the case of the crossover type, a great number of screening and furnace firing operations are necessary. The greater the number of firing operations, the lower the yield of the circuit.

Still another method of making multi-layer circuits requires a precise locating of each layer and a fusing of the conductors at via holes. This arrangement also finds disadvantage in its costly operation and yield problem due to the very great number of connections that must be made.

Accordingly, it is the object of the present invention to provide a means to interconnect components of a circuit in an efficient and simple process when such interconnections are of such complexity so as to require multi-layer circuit techniques.

SUMMARY OF THE INVENTION

In accomplishing the option of the present, there is provided a multi-layered printed circuit arrangement having at least a first combination including a first insulative substrate having a top and a bottom surface. The top surface includes a first set of spaced and parallel conductors and the bottom surface includes a second set of spaced parallel conductors. The first set of conductors is further divided into at least first and second conductor groups by a transversely oriented break across each conductor. Similarly, the second set of conductors is also divided into at least third and fourth conductor groups by a transversely oriented break across each conductor. The second set of spaced and parallel conductors are oriented perpendicular to the first set of conductors. The plurality of openings extend between the top and the bottom surfaces with each opening located adjacent to an intersection of a different one of the first and second set of conductors.

A second insulative substrate having a top and a bottom surface and a plurality of plated through openings is arranged to have its top surface attached to the first insulative substrate bottom surface with each of the second insulative substrate openings in registration with a respective one of the first insulative substrate openings. The second insulative substrate top surface further includes first connecting means extending from at least one of the plated through openings and contacting one of the first insulative substrates second set of conductors. The second insulative substrate top surface may further include at least one conductor segment for interconnecting one conductor of the first insulative substrate's third conductor group to at least one conductor of the fourth conductor group. The second insulative substrate further includes second connecting means on the bottom surface which also extend from at least one of the plated through openings.

The first combination is completed by the addition of a third insulative substrate which is identical to the first insulative substrate. The third insulative substrate has its top surface attached to the second insulative substrate bottom surface and the second insulative substrate's second connecting means is arranged to contact one of the third insulating substrate's second set of conductors. The second insulative substrate bottom surface may further include at least one conductor segment for interconnecting one conductor of the third insulative substrate's first conductor group to at least one conductor of the second conductor group.

Additionally, the combination described above can be expanded by the addition of at least one additional second combination which includes a fourth insulative substrate identical to the second insulative substrate. The fourth insulative substrate's top surface attaches to the third insulative substrate's bottom surface when the fourth insulative substrate's opening in registration with the third insulative substrate openings. The fourth insulative substrate's first connecting means contacts at least one of the third insulative substrate's second set of conductors.

A fifth insulative substrate identical to the first insulative substrate has its top surface attached to the fourth insulative substrate's bottom surface and the fifth insulative substrate's openings in registration with a respective one of the fourth insulative substrate's openings. The fourth insulative substrate's second connecting means contacts at least one of the fifth insulative substrate's first set of conductors.

The first circuit combination and the second circuit combination are interconnected by interconnection means extending through the plated through openings of at least the second and fourth insulative substrates, connecting the first and second connecting means of the second insulative substrate to the first and second connecting means of the fourth insulative substrate.

DESCRIPTION OF THE PREFERRED EMBODIMENT

Figure 1:
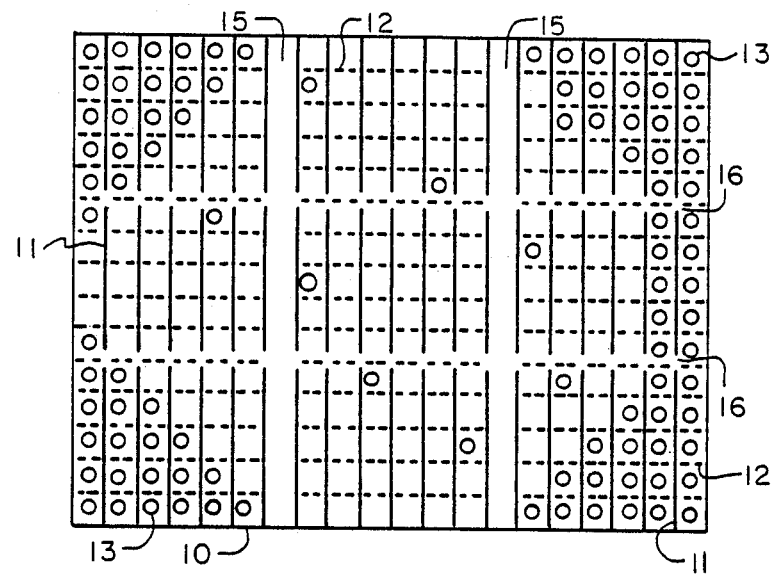
FIG. 1 is a top plan view of the first insulative substrate or A-type layer of the present invention.
Figure 2:
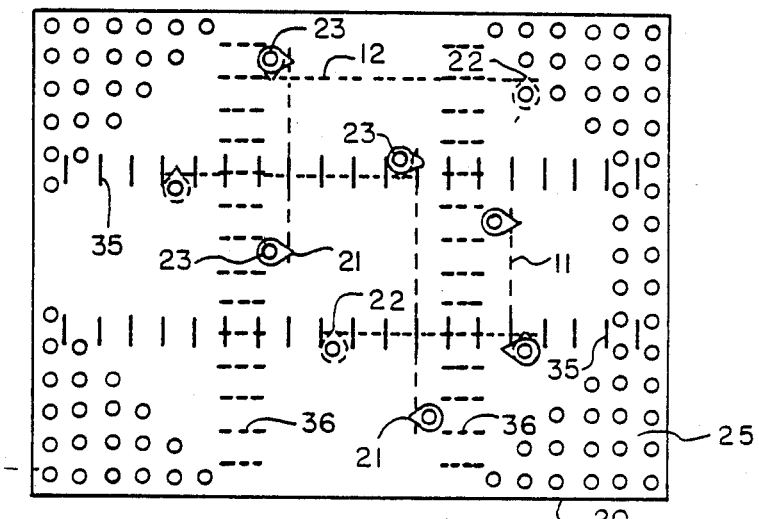
FIG. 2 is a top plan view of the second insulative substrate or B-type layer in accordance with the present invention.

The proposed arrangement of the present invention utilizes two types of layer elements, an A type layer as shown in FIG. 1 and a B type layer as shown in FIG. 2. By identifying the layers and conductor paths, very simple charts can be generated for the interconnection of the A type layers with the B type layers.

The A type layer 10 as shown in FIG. 1 is essentially a sheet of GE ULTEM ® or DUPONT KAPTON ® plastic approximately 5 mils. or greater in thickness, with segmented conductor paths 10 mils. wide spaced 50 mils. apart. The conductor pattern is generated by etching foil backed sheets or employing an additive process. The conductors 12 run in the horizontal direction or X direction on one side of the sheet and conductors 11 in the vertical direction or Y direction on the opposite side. Conductors 12 are interrupted by breaking conductors 12 along a common axis shown as 15 perpendicular to conductors 12 direction. Conductors 11 are also interrupted by breaking conductors 11 along a common axis shown as 16 perpendicular to conductors 12 direction. The interruption of conductors 11 and 12 divides the conductors into 18 distinct groups which are electrically isolated from each other. At the center of the squares defined by X and Y conductors 12, 11, a 20 mil. diameter hole 13 is made. It should be noted that the dimensions stated are merely for purposes of example and the invention is not limited thereto.

The B type layer 20 as shown in FIG. 2 is comprised of approximately 25 mil. or greater thick GE ULTEM ® or DUPONT KAPTON ® plastic sheet with 20 mil. diameter holes 23 in the same precise pattern as the holes 13 in the A layer 10. In addition, an element of a conductor 22, 21, hereafter termed a penant, may be generated on either side of this layer or on both sides at right angles to each other and connected by a plated-through hole 23. The penants 22, 21 ring the 20 mil. diameter hole 23 and project outward approximately 0.030 inches either in the X or Y direction, depending upon its function. Where penants 22, 21 on opposite sides are interconnected by plated-through holes, they are always at right angles to each other. The B type layer 20 further includes conductor segments 35 on side 25 and conductor segments 36 on side 26. The conductor segments are used when a conductive bridge is required between one group and the next. A conductor segment 35 would be used to electrically connect a conductor 11 of one group to the next. One or more of the conductor segments 35 and 36 may be used depending on the final circuit layout.

Figure 3:
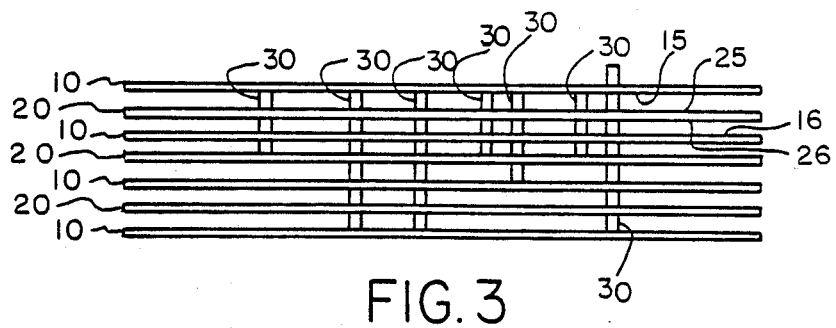
FIG. 3 is an exploded elevational view showing the stacking arrangement of the A-type layers to the B-type layers and the interconnection of the layers using via pins.

As shown in FIG. 3, the assembled A type layers 10 are placed on the bottom and the top of the B type layers 20. Conductors 11 in the X direction (the bottom 15 of the A type layer 10) become accessible to the top 25 of the B type layer 20. Conductors 11 in the Y direction (the top 16 of the A type layer 10) become accessible to the bottom 26 of the B type layer 20. The bottom side of the B type layer 20 will have required penants 21 pointing in the X direction so as to intersect Y direction conductors and the top 25 of B type layer 20 will have required penants 22 pointing in the Y direction so as to intersect the X direction conductors 12 of the associated A type layer 10. The various layers are interconnected by via pins 30 which are inserted into appropriate holes 13, 23 respectively. The via pins 30 may be hollow (tubes) or tubular on one end for receiving component leads, or the tubes may act as receptacles for the pins, of a socket type device, into which components can be plugged.

The conductors 11, 12 penants 21, 22 and conductor segments 35, 36 of the A type 10 and B type 20 layers respectively are solder coated with the A type layer 10 leveled with a hot-air knife, leaving a solder thickness of 1-2 mils. The assembled A and B type layers and via pins are subjected to heat and some pressure, which reflows the solder joining the penants 21, 22 to the via pins 30 and conductor segments 35 and 36 to their appropriate X and Y conductor runs. This results in an integral multi-layer circuit with more efficient use of area for conductor interconnections than present used multi-layer systems.

Figure 4:
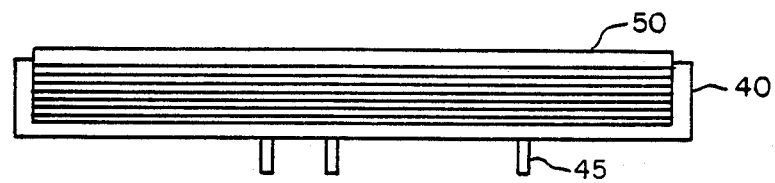
FIG. 4 is an elevational view showing the multi-layered printed circuit arrangement of the present invention packaged on a plastic base and including via pins acting as terminals.

As shown in FIG. 4, the final top layer 50 of the arrangement may receive component parts with socket terminals acting as via pins or ceramic hybrid thick/thin film circuits with holes for access to via pins. The bottom may be inserted to a plastic base or retainer 40 with longer via pins 45 acting as terminals for the multi-layer package.

Areas not required to be connected within the multi-layer package could be protected by solder resist.

It will appreciated by those skilled in the art that the A type layer 10 is a standard component part and thus would be quite cost effective since a large quantity can be processed at one time and stored until ready for assembly in a multi-layer package.

The B type layer 20, although not a standard part, uses a standard tab penant 21, 22 and thus generation of art work for any required pattern becomes relatively simple. The via pins may be interconnected to any level, creating the potential for very complex interconnections. Finally, the scheme gives the circuit designer great flexibility as he can prototype circuits in a very short time.

Although the preferred embodiment of the invention has been illustrated, in that form described in detail, it will be readily apparent to those skilled in the art that various modifications may be made therein without departing from the spirit of the invention or from the scope of the appended claims.

What is claimed is:

1. A multi-layered circuit arrangement having at least a first combination comprising:
    a first insulative substrate having a top and a bottom surface, said top surface including a first set of spaced and parallel conductors having at least one transversely oriented break across each conductor isolating said first set of conductors into a first conductor group and a second conductor group, and said bottom surface including a second set of spaced and parallel conductors oriented perpendicular to said first set of conductors said second set of conductors having at least one transversely oriented break across each conductor isolating said second set of conductors into a third conductor group and a fourth conductor group, and a plurality of openings extending between said top and bottom surfaces, each opening located adjacent to an intersection of a different one of said first and second set of conductors;

a second insulative substrate having a top and a bottom surface and a plurality of plated through openings, said second insulative substrate top surface attached to said first insulative substrate bottom surface with each of said second insulative substrate openings in registration with a respective one of said first insulative substrate openings, said second insulative substrate top surface further including first connecting means extending from at least one of said plated through openings and contacting one of said first insulative substrate's second set of conductors, and said second insulative substrate bottom surface including second connecting means extending from at least one of said plated through openings; and, a third insulative substrate identical to said first insulative substrate having its top surface attached to said second insulative substrate bottom surface and said second insulative substrate second connecting means contacting one of said third insulative substrate's first set of conductors.

2. A multi-layered circuit arrangement as claimed in claim 1, wherein: said second insulative substrate top surface further includes at least one conductor segment connecting at least one conductor of said first insulative substrate third conductor group to at least one conductor of said fourth conductor group.

3. A multi-layered circuit arrangement as claimed in claim 2, wherein: said second insulative substrate bottom surface further includes at least one conductor segment connecting at least one conductor of said third insulative substrate first conductor group to at least one conductor of said fourth conductor group.

4. A multi-layered arrangement as claimed in claim 3, wherein; there is provided a second combination comprising;

a fourth insulative substrate identical to said second insulative substrate, said fourth insulative substrate top surface attached to said third insulative substrate bottom surface and said fourth insulative substrate openings in registration with a different one of said third insulative substrate openings, and said fourth insulative substrate first connecting means contacting one of said third insulative substrate's second set of conductors; and, a fifth insulative substrate identical to said first insulative substrate having its top surface attached to said fourth insulative substrate bottom surface and said fifth insulative substrate openings in registration with a different one of said fourth insulative substrate openings and said fourth insulative substrates second connecting means contacting at least one of said fifth insulative substrate's first set of conductors.

5. A multi-layered circuit arrangement as claimed in claim 4, wherein; said first circuit combination and said second circuit combination are interconnected by interconnection means extending through said plated through openings of at least said second and fourth insulative substrates, connecting said first and second connecting means of said second insulative substrates to said first and second connecting means of said fourth insulative substrate.

6. A multi-layered printed circuit arrangement as claimed in claim 5, wherein: said first insulative substrate top surface is arranged to accommodate electrical elements having terminals.

7. A multi-layered printed circuit arrangement as claimed in claim 6, wherein: said interconnection means are tubular via pins having hollow portions and said hollow portions extend outward of said first insulated substrate.

8. A multi-layered printed circuit arrangement as claimed in claim 7, wherein: said first and said second combinations are housed in a plastic base, said base including openings and said via pins extend outward of said fifth insulative substrate and said base through said base openings forming terminal pins arranged to be connected to a source of electrical signals.

9. A multi-layered circuit arrangement as claimed in claim 4, wherein: said first connecting means is a pennant shaped conductor extending from an associated substrate opening in a first direction.

10. A multi-layered circuit arrangement as claimed in claim 9, wherein: said second connecting means is a pennant shaped conductor extending from an associated substrate opening in a second direction orthogonal to the direction of said first connecting means.

* * * * *